(12) United States Patent
Elahi et al.

(10) Patent No.: US 8,213,555 B2
(45) Date of Patent: Jul. 3, 2012

(54) METHODS AND APPARATUS TO IMPROVE DISTORTION PERFORMANCE AND DIRECT CURRENT (DC) OFFSET CANCELLATION IN RECEIVERS

(75) Inventors: Imtinan Elahi, Richardson, TX (US); Khurram Muhammad, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 712 days.

(21) Appl. No.: 12/397,994

(22) Filed: Mar. 4, 2009

(65) Prior Publication Data
US 2009/0225911 A1    Sep. 10, 2009

Related U.S. Application Data

(60) Provisional application No. 61/033,989, filed on Mar. 5, 2008.

(51) Int. Cl.
*H03D 1/04* (2006.01)

(52) U.S. Cl. ........ 375/346; 375/348; 375/345; 375/350; 375/254

(58) Field of Classification Search .................. 375/346, 375/348, 345, 350, 254
See application file for complete search history.

(56) References Cited

U.S. PATENT DOCUMENTS
2008/0014895 A1 * 1/2008 Li et al. .......................... 455/324
* cited by examiner

*Primary Examiner* — Kabir A Timory
(74) *Attorney, Agent, or Firm* — Alan A. R. Cooper; Wade James Brady, III; Frederick J. Telecky, Jr.

(57) ABSTRACT

Methods, apparatus, and articles of manufacture are described for improving distortion performance and for direct current offset cancellation in receivers. In one example, a method of improving distortion in a receiver includes determining a direct current (DC) amplitude of an offset signal, generating the offset signal, and providing the offset signal to an output of a mixer to improve the distortion performance of the mixer.

8 Claims, 3 Drawing Sheets

METHODS AND APPARATUS TO IMPROVE DISTORTION PERFORMANCE AND DIRECT CURRENT (DC) OFFSET CANCELLATION IN RECEIVERS

TECHNICAL FIELD

This application claims the benefit of U.S. Provisional Application No. 61/033,989, filed Mar. 5, 2008, the entirety of which is incorporated by reference.

TECHNICAL FIELD

The present disclosure pertains to communication systems and, more particularly, to methods and apparatus to improve distortion performance and direct current (DC) offset cancellation in receivers.

BACKGROUND

Referring to FIG. 1, a known example digital communication system 100 typically includes a base transceiver station (BTS) 102 that communicates with a communication network and one or more mobile units 104. The communication between the BTS 102 and the mobile unit 104 may be carried out using communication techniques such as code-division multiple access (CDMA), time-division multiple access (TDMA), and the like.

As will be readily appreciated by those having ordinary skill in the art, digital communication systems, such as that of FIG. 1, convert analog signals, such as voice signals, into digital audio signals, which are represented by bits. The digital audio signals are transmitted on a high frequency (HF) signal, e.g., 1800 megahertz (MHz), using digital modulation techniques such as phase shift keying (PSK), quadrature phase shift keying (QPSK), differential quadrature phase shift keying (DQPSK), and the like.

For example, with reference to FIG. 1, the BTS 102 may receive an analog voice signal from the network, wherein the voice signal is to be transmitted from the BTS 102 to the mobile unit 104. The BTS 102 samples the analog voice signal to create a corresponding digital audio signal and broadcasts the digital audio signal to the mobile unit 104 on an analog HF signal.

The mobile unit 104 typically includes a receive lineup that converts the received analog HF signal to one or more intermediate frequency (IF) signals, before converting the received signal to the digital domain (i.e., a digital signal) for processing. After the digital domain processing is complete, the digital audio signal is converted into an analog signal for presentation to a user via a speaker.

Known receiver lineups may be configured as, for example, very low IF (VLIF) lineups or direct conversion (DCR) lineups. A VLIF lineup uses an analog front end to convert an HF signal into a very low IF signal that is further converted into the baseband signal that may be processed. In contrast, DCR lineups convert a received HF signal directly to a baseband signal.

Two major impairments to VLIF and DCR wireless lineups are second order intermodulation distortion (IMD2), which may be expressed in terms of input referred second order intercept point (IIP2), and DC offset. IIP2 is the theoretical input level at which second-order, two-tone distortion products are equal in power to the desired signals. Thus, the higher the IIP2, the better the distortion performance of the receiver. One major cause of IIP2 degradation is local oscillator (LO) leakage to the inputs of various RF receiver circuits, including downconverting mixers. Mixer IIP2 performance limits overall receiver IIP2 performance.

Additionally, it is a known problem that analog front ends output an undesired direct current (DC) component in addition to the received signal. The DC component reduces the dynamic range of analog-to-digital converters (A/D), as well as degrades the performance of other components in the receive lineup. Additionally, the DC component appears as a noise contribution in detection phase of reception, thereby generating undesirable artifacts that make signal detection difficult. In particular, the DC component will appear as a tone after further mixing or down-conversion to zero-IF.

SUMMARY

Methods and apparatus improve distortion performance and direct current (DC) offset cancellation in receivers are described. According to one example, a method of improving distortion in a receiver includes determining a direct current (DC) amplitude of an offset signal, generating the offset signal, and providing the offset signal to an output of a mixer to improve the distortion performance of the mixer. Other examples are shown and described.

DETAILED DESCRIPTION

Figure 1:
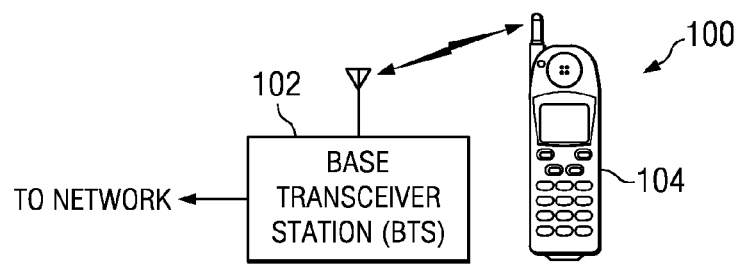
FIG. 1 is a diagram of an example communication system.
Figure 2:
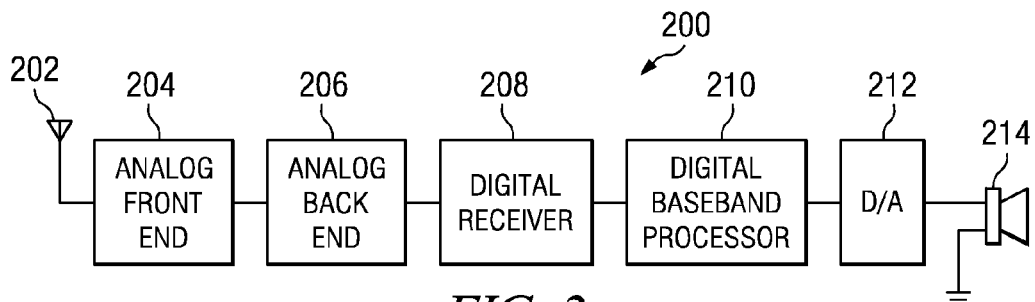
FIG. 2 is a block diagram of an example receive lineup that may be implemented in a mobile unit.

FIG. 2 illustrates a receive lineup 200, such as may be found in cellular mobile units, or in any other devices that receive and process low-IF digital communication signals. In the receive lineup 200, an antenna 202 receives HF signals (e.g., cellular, personal communication system (PCS), etc.) and couples the received signals to an analog front end 204. As described in detail below in conjunction with FIG. 3, the analog front end 204 may amplify and down convert the received signals to a low-IF signal, and provide the low-IF signal to an analog back end 206. The analog back end 206 may further amplify the low-IF signal and convert the same to a digital signal. As noted previously, LO leakage from, for example, the analog front end, may inhibit receiver IIP2 performance.

As described in detail below, the receive lineup 200 injects a first non-zero DC offset at the output of one or more mixers in the front end, thereby improving the IIP2 performance of the receiver. The injected DC offset at the mixer output leaks through mixer switches into the mixer and is up-converted to LO frequency by the mixer. Thus, when up-converted, the DC signal acts as an anti-LO leakage signal, thereby recovering the degradation in IIP2 caused by the LO leakage.

In general, the DC offset that is injected to the mixer output must be relatively large because mixer reverse leakage is typically small. The injected DC offset may be amplified at is passes through the balance of the receive lineup 200 and is amplified by the various base band amplifiers, etc. Thus, a second DC offset may be injected into the receive lineup 200 at a second point (either before or after the base band amplifier) to remove the injected DC offset that corrects IIP2 performance. Thus, the injected DC offset is never passed to A/D converters in the receive lineup 200 and, therefore, does not affect A/D performance of the system.

As explained in detail below, both DC offset injection circuits (i.e., the circuit that injects DC to the mixer output and the circuit that removes DC offsets prior to A/D conversion) may be implemented using mixed-signal circuits. For example, a DC offset injection amplitude may be calculated and digitally output to a digital-to-analog converter (D/A) that produces the analog DC offset that is coupled to the circuit to improve IIP2 performance or remove DC offsets prior to A/D conversion. In such arrangements, the D/A could be implemented as a Nyquist D/A or a sigma-delta D/A, either of which may be followed by analog/discrete-time filters to remove noise shaping. Alternatively, the DC offset injection circuits may be implemented using analog techniques.

After the analog processing is performed by the analog front and back ends 204, 206, the low-IF signal is coupled to a digital receiver 208, which produces zero-IF signals that are coupled to a digital baseband processor 210. The output of the digital baseband processor 210 is provided to a D/A 212, which produces analog audio signals that may drive, directly or indirectly, a speaker 214. Of course, an amplifier, a filter, or other circuitry may be placed between the D/A 212 and the speaker 214.

Figure 3:
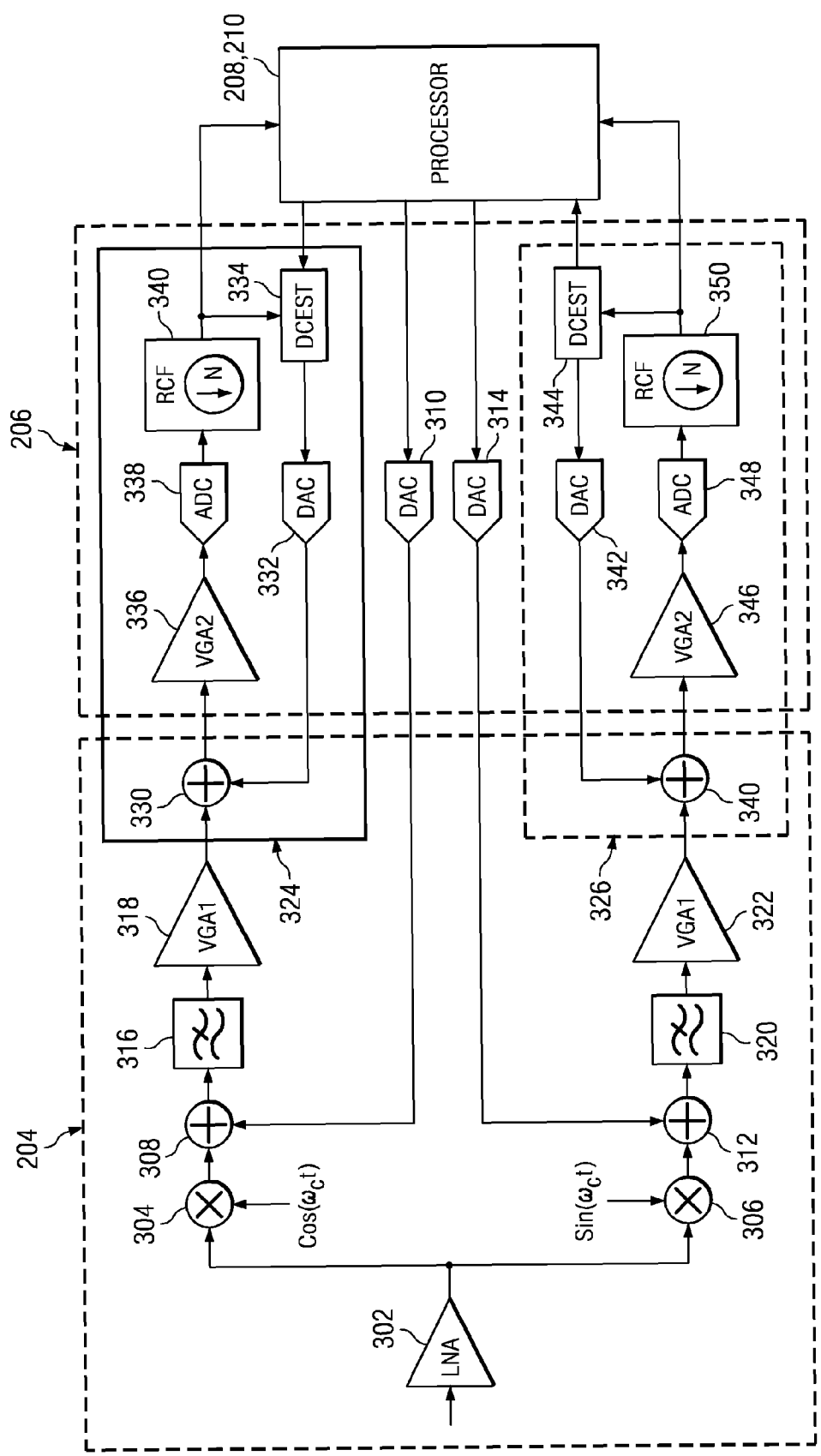
FIG. 3 is a block diagram showing additional detail of the analog front end and the analog back end of FIG. 2.

Further detail of example implementations of the analog front end 204, the analog back end 206 is shown in FIG. 3. FIG. 3 also represents the functionality of the digital receiver 208 and the digital baseband processor 210 as a single processor. Of course, the distribution of functionality shown in FIG. 3 may vary, such that some functionality of the analog front end 204 may be implemented in the analog back end 206. Similarly, functionality shown in the analog back end 206 may be implemented within the analog front end 204. As a further alternative, the designation of analog front end and analog back end may be eliminated in favor of implementing all functionality in a single functional block. Furthermore, though the digital receiver 208 and the baseband processor 210 are shown as a single processor for each of description in FIG. 3, the digital reception and baseband processing may be carried out using separate components or processors, such as a digital signal processor, a microprocessor, and the like.

The antenna provides HF signals, having frequencies used by any standard cellular, PCS, or other digital communication system, to a low noise amplifier (LNA) 302. In the example, of FIG. 3, the LNA 302 is connected to two mixers 304, 306, which are respectively provided with local oscillators (LOs) that are 90 degrees out of phase (i.e., the mixer 304 is provided with a cosine LO and the mixer 306 is provided with a sine LO). Thus, the outputs of the mixers 304 and 306 are respectively quadrature and in-phase baseband signals, each of which is subsequently handled by a respective path in the analog front end 204 and the analog back end 206. One example of this technique is explained in detail in U.S. Publication No. 20070105522, entitled "Offset Balancer, Method of Balancing an Offset and a Wireless Receiver Employing the Balancer and the Method" by K Muhammad et. al., which is hereby incorporated by reference in its entirety in the current application.

The output from the mixer 304 is coupled to an adder 308, which adds a DC offset provided by the D/A 310 to the mixer output. As noted previously, the addition of the DC offset to the mixer 304 output improves the IIP2 of the receiver. Similarly, an adder 312 receives an output signal from the mixer 306 and adds the same to a DC offset provided by the D/A 314.

Figure 4:
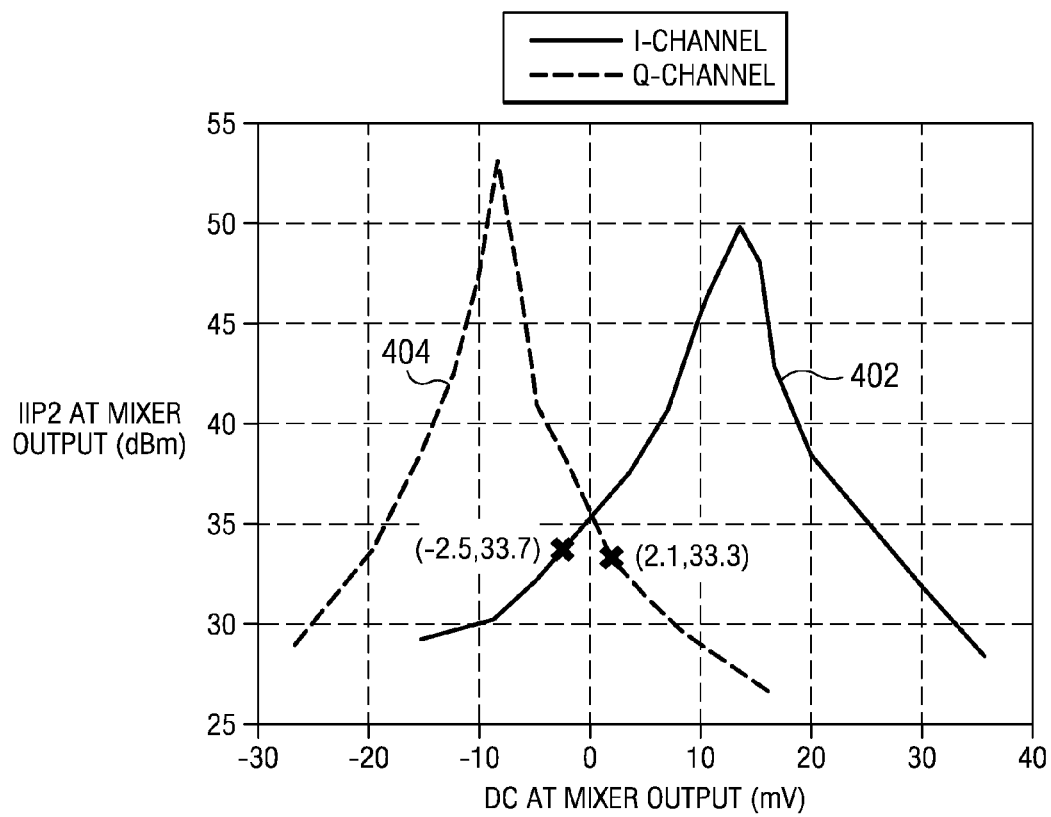
FIG. 4 is a chart showing IIP2 performance at mixer output versus DC voltage injected to the mixer output.

As explained above, injecting a DC offset at a mixer output improves the IIP2 performance of the mixer and, thus, the remainder of the receiver lineup. For example, as shown in FIG. 4, which plots IIP2 at mixer output (in dBm) against the DC at the mixer output (in millivolts), a first curve 402 shows the IIP2 performance at the in-phase channel mixer output and a second curve 404 shows the IIP2 performance at the quadrature channel mixer output. As shown in the first curve 402, the IIP2 at the mixer 306 output is best when about 12 millivolts (mV) are applied at the mixer 306 output. Further, as shown in the second curve 404, the IIP2 at the mixer 304 output is best when about −9 mV are applied at the mixer 304 output. Of course, depending on mixer reverse leakage, the values of the DC voltages resulting in optimal IIP2 performance may vary.

The output of the adder 308, which includes the DC offset and the output of mixer 304, is provided to a filter 316 and, further, to a variable gain amplifier 318. Similarly, the output of the adder 312 is processed by a filter 320 and, further, by a variable gain amplifier 322. The outputs of the variable gain amplifiers 312, 322 are respectively provided to DC offset cancellers 324, 326, respectively. The DC offset cancellers 324, 326 remove the DC offset injected at the adders 308, 312, respectively, as well as remove any other undesirable DC offsets. This loop may be referred to as an outer loop, or the outer DC offset compensation loop. The feedback loop is operated under the control of the processor 208, 210 that can operate the loop in an open loop approach whereby a compensation value is determined for a period of time while a previous compensation value is held constant to the feedback D/A 310. The compensating values to the D/A 310, 342 can be supplied by the DC offset cancellers 324, 326, or directly by the processor 208, 210.

The DC offset canceller 324 includes an adder 330 that adds a DC offset to the signal from the variable gain amplifier 318. The DC offset signal is provided by the D/A 332, which is controlled by the DC estimator 334. Collectively, the DC estimator 334 and the D/A 332 produce a DC signal that is equal in magnitude, but opposite in sense, to the DC component of the signal provided to the adder 330 from the variable gain amplifier 318. Thus, the output of the adder 330 has substantially all of the DC voltage removed therefrom.

The output of the adder 330 is coupled to a variable gain amplifier 336, which amplifies the signal from the adder 330 before the same is processed by an A/D 338. The digital output from the A/D 338 is processed by a reconstructive filter 340, which may include downsampling. The output of the reconstructive filter 340 is coupled to the processor 208, 210, as is the DC estimate from the DC estimator 334, which, as described below, operates on the output of the reconstructive filter 340 to estimate the DC component in the signal provided to the adder 330. A closed feedback loop is formed between the adder 330, the variable gain amplifier 336, the D/A 338, the reconstructive filter 340, the DC estimator 334, and the D/A 332 to remove the DC from the signal provided by the variable gain amplifier 318. This loop may be referred to as the inner loop or the inner DC compensation loop. As shown in FIG. 3, this feedback loops is under the control of the processor 208, 210 that can operate the loop in an open loop approach, whereby a compensation value is determined for a period of time while a previous compensation is held constant to the feedback DAC. The DC offset canceller 324 removes the DC offset injected by the adder 308. The compensating value to the D/A 332, 342 can be supplied by 324 or directly by the processor 208, 210.

The DC offset canceller 326 includes an adder 340 that adds a DC offset to the signal from the variable gain amplifier 322. The DC offset signal is provided by the D/A 342, which is controlled by the DC estimator 344. Collectively, the DC estimator 344 and the D/A 342 produce a DC signal that is equal in magnitude, but opposite in sense, to the DC component of the signal provided to the adder 340 from the variable gain amplifier 322. Thus, the output of the adder 340 has substantially all of the DC voltage removed therefrom.

The output of the adder 340 is coupled to a variable gain amplifier 346, which amplifies the signal from the adder 340 before the same is processed by an A/D 348. The digital output from the A/D 348 is processed by a reconstructive filter 350, which may include downsampling. The output of the reconstructive filter 350 is coupled to the processor 208, 210, as is the DC estimate from the DC estimator 344, which, as described below, operates on the output of the reconstructive filter 350 to estimate the DC component in the signal provided to the adder 340. A closed feedback loop is formed between the adder 340, the variable gain amplifier 346, the D/A 348, the reconstructive filter 350, the DC estimator 344, and the D/A 342 to remove the DC from the signal provided by the variable gain amplifier 322. Thus, the DC offset canceller 326 removes the DC offset injected by the adder 312.

In one example, the adders 308, 330, 312 and 322 may not be physical blocks that implement the addition function. In one example, the mixers 304 and 306 shown in FIG. 3 may be implemented as Gilbert cell mixers in which an active device provides RF current to flow through the mixer, creating an output voltage across the load driven by the mixer. If the mixers are passive, a low noise amplifier is used to drive the current. The D/As also drive currents (proportional to their digital input values) to the same load. The addition happens at the load by the principle of superposition whereby the two currents sum up to provide a resulting current that flows through the load and produces a voltage signal. This voltage signal appears as a baseband signal input to the following elements 316 and 320, respectively, for the in-phase and quadrature paths. The same principle can be used in the following inner offset correction loop, whereby the D/A and VGA1 drive currents to the load presented at the input of VGA2 and the currents summing up to form a resultant input current.

Figure 5:
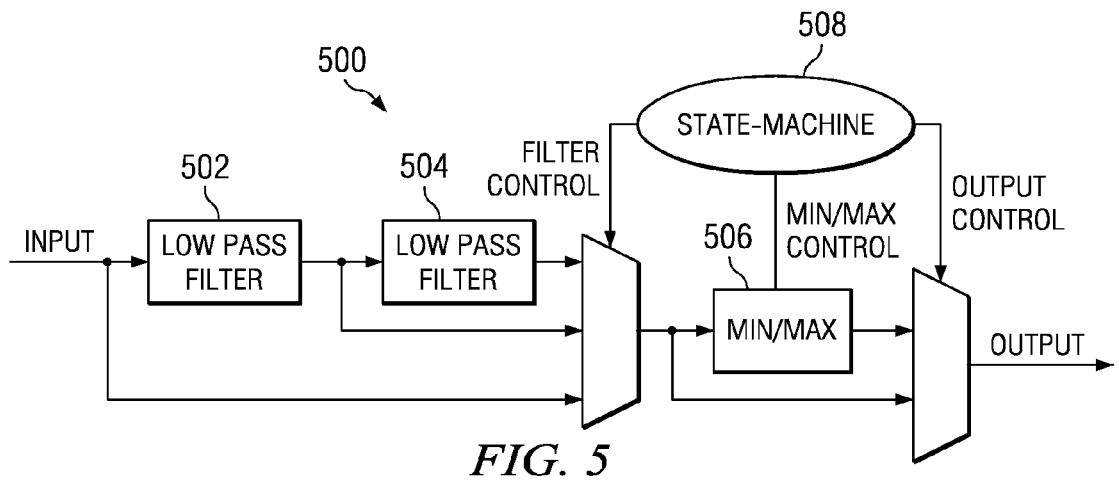
FIGS. 5 and 6 illustrate example DC Estimation (DCEST) engines that may be used to perform the DC estimation of FIG. 3.

An example DC estimator, which may be used to implement either or both of the DC estimators 334, 344 of FIG. 3, is shown in FIG. 5 at reference numeral 500. The DC estimator 500 of FIG. 5 produces estimates of the DC in the signal from the variable gain amplifier (e.g., the variable gain amplifier 318 or 322) and provides feedback to eliminate the same. The example DC estimator 500 of FIG. 5 includes a programmable cascade of low-pass filters 502, 504 followed by a min/max unit 506 that operates under the command of a state-machine 508. The state-machine 508 can be controlled by a processor (e.g., the processor 208, 210). The min/max unit 506 computes the minimum and the maximum values of the signal that passes through it. When the DC value of a signal needs to be estimated, the input data is passed through the min/max unit 506 so that it can calculate the minimum and the maximum values. At the end of the sequence, the state-machine 508 reads the minimum and maximum values and computes the difference between the two to obtain the peak-to-peak signal value and the sum to obtain average value. The average value is an estimate of the DC signal.

The purpose of low-pass filters 502, 504 is to help obtain a better average value, i.e., to reduce the noise of the DC estimate. The average value thus can be computed over several streams of data under the control of the state-machine 508 that resets the min/max unit 506 at the end of each estimate. The final DC value can be calculated by taking an average value of all the average values obtained in each run. The filters 502, 504 shown can have programmable pass-bands that may be controlled by the state-machine 508.

Figure 6:
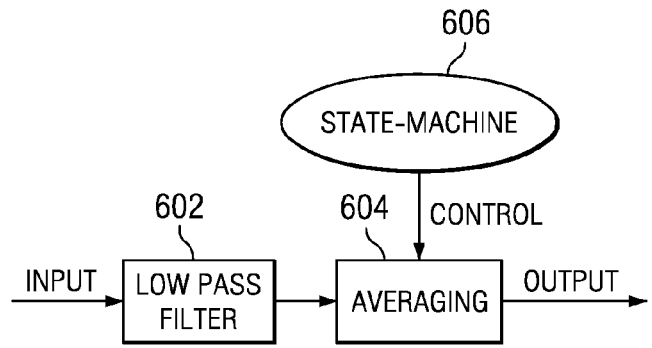

FIG. 6 shows an alternate approach to calculating the DC value, which may be used to implement a DC estimator (e.g., the DC estimators 334, 344 of FIG. 3). An input signal is passed through a low pass filter 602 and provided to an averaging unit 604, which can be operated under the control of a micro-processor or state machine 606, as described above. The average value produced by the averager 604 is a representative of the DC signal. The purpose of the low pass filter 602 is to restrict the noise seen by the averaging unit so as to enable it to obtain a superior estimate of the DC value. The pass band of the low pass filter 602 may be programmable. It is conceivable that to assist the filter settling, the pass band is increased in the initial part of the data and tightened subsequently to allow better estimation. Not shown in FIGS. 5 and 6 are possibilities of applying windowing functions on the sequences on which the averaging are performed, however, it is clear to those having ordinary skill in the art that techniques used to improve the accuracy of estimate of DC value can be readily applied.

Having described the architecture of example systems that may be used to improve distortion performance and DC offset cancellation in receivers, a process of improving distortion and removing DC offsets is described. Although the following describes a process through the use of a flow diagram having blocks, it should be noted that the process may be implemented in any suitable manner. For example, the processes may be implemented using, among other components, software, or firmware executed on hardware. However, this is merely one example and it is contemplated that any form of logic may be used to implement the systems or subsystems disclosed herein. Logic may include, for example, implementations that are made exclusively in dedicated hardware (e.g., circuits, transistors, logic gates, hard-coded processors, programmable array logic (PAL), application-specific integrated circuits (ASICs), etc.) exclusively in software, exclusively in firmware, or some combination of hardware, firmware, and/or software. For example, instructions representing some or all of the blocks shown in the flow diagram may be stored in one or more memories or other machine readable media, such as hard drives or the like. Such instructions may be hard-coded or may be alterable. Additionally, some portions of the process may be carried out manually. Furthermore, while each of the processes described herein is shown in a particular order, those having ordinary skill in the art will readily recognize that such an ordering is merely one example and numerous other orders exist. Accordingly, while the following describes example processes, persons of ordinary skill in the art will readily appreciate that the examples are not the only way to implement such processes.

Figure 7:
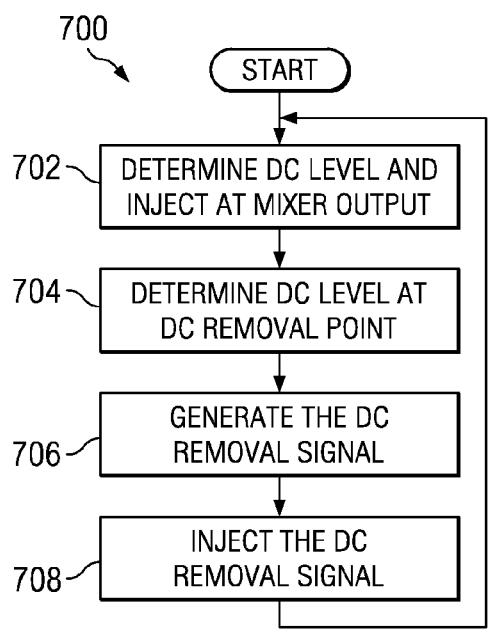
FIG. 7 is a flow diagram of an example distortion improvement and DC offset cancellation process that may be carried out by the analog front end, the analog back end, and/or the digital receiver of FIGS. 2 and/or 3.

As shown in FIG. 7, a distortion improvement and DC removal process 700 determines a DC level to inject at an output of a mixer (block 702). For example, with reference to FIG. 3, the processor 208, 210 determines the DC offset to be injected at the adder 308 and the adder 312. The DC offset may be determined preset using, for example, a look-up table or may be determined on the fly based on information received at the processor 208, 210. For example, the DC offset level may be hard-coded base, for example, on the plots shown in FIG. 4, wherein the DC offset level that is selected has been predetermined to maximize the IIP2 performance at the mixer output.

The determined DC offset level is injected, according to the example of FIG. 3, through the use of a D/A 310 that converts digital control signals into analog signals that are provided to the adder 308. A similar process is repeated for the in-phase channel in which the processor 208, 210 determines the DC offset level and provides a digital word representing the same to the A/D 314, which produces an analog output signal that is provided to the adder 312.

Alternatively, the processor 208, 210 may process signal from the RCF 340 and determine from such signals the IIP2 of the system. Based on the IIP2 of the system, the processor 208, 210 may then empirically determine the DC offset level that maximized the IIP2 level of the receiver by experimenting with different DC offset levels and determining which DC offset level yields the optimal or desired IIP2 performance of the system.

To this point in the process 700, the deleterious effects of LO leakage on receiver IIP2 performance have been mitigated by injecting a DC offset signal at one or more mixer outputs. As described above, the injection of the DC offset at a mixer output causes, through mixer reverse leakage, signals that cancel out the LO leakage at the mixer input.

While the injection of DC at mixer output improves receiver IIP2 performance, the DC offset, if left in the received signal, will have a deleterious effect on the operation of the receiver components downstream from the injected DC offset. Thus, it is desirable to remove the injected DC offset at a DC removal point. As shown in FIG. 3, the DC removal point may be at the output of the variable gain amplifier 318 in the quadrature branch and at the output of the variable gain amplifier 322 in the in-phase branch. The DC estimators 334, 344 determine a DC offset level that is present at the DC removal point (block 704). The DC estimate by be carried out by averaging or by any other suitable technique, such as those shown in FIGS. 5 and/or 6. For example, the DC offsets may be estimated at the outputs of the RCF 340 and the RCF 350.

A removal signal is then generated based on the DC offset (block 706). For example, the removal signal may be equal in magnitude, but opposite in sense from the estimated DC offset. For example, if the DC estimator 340 determines that there is 10 mV at the output of the variable gain amplifier 318, the D/A 332 may be controlled to generate an output signal of −10 mV to null out the estimated DC.

In one example, the correct DC can only be applied through a gain de-embedding process. Assuming that the inner loop provides zero DC, the DC at the mixer output will appear at the A/D output gained up by the gain of element 320+VGA1+VGA2. This gain is then de-embedded in order to force a desired DC signal at the mixer output. For example, to force DC value 'D' at the mixer output and G1 is the gain of element 320+VGA1+VGA2. The DC at the ADC output will appear as 'D×G1'. Let 'F' be the gain of the feedback DAC which is known either by simulation or by characterization. Then, if we apply a known value 'k/F' at DAC input, it will produce 'k×G1' of DC at the output of the ADC. This output should be divided by k to extract G1. Hence, G1 can be measured by a test signal (DC or tone) and F can be known by characterization. Knowledge of the two can be used to produce any desired DC signal 'D' at the mixer output by calculating a digital DC value 'D/F' to be applied to the DAC and which will produce 'D×G1' at the ADC output.

After the DC removal signal has been generated (block 706), the DC removal signal is injected into the receive lineup (block 708). For example, a D/A 332 may generate a nulling DC signal to remove the estimated DC at the output of the variable gain amplifier 318 and that nulling DC signal is injected at the adder 330. Thus, the DC at the output of the adder 330 is the difference between the DC at the output of the variable gain amplifier 318 and the DC estimate provided by the D/A 332.

The second compensation applied at the VGA input normally forces the DC signal going into the VGA to become zero. In this example case, the digital DC estimated by the digital circuits 500 should estimate the DC signal value to become zero. It may be useful to force a certain predetermined DC at the input of the VGA to by forcing the DC at circuit 500 output to be a predetermined value. This can be used to force an imbalance at the VGA input to a predetermined value, causing an improved IP2 of the VGA+ADC combo. While the outer-loop forces a predetermined DC at the mixer output that maximizes the IP2 of the LNA+mixer, the inner loop forces a second predetermined DC at the VGA input, thereby maximizing the IP2 of the VGA+ADC combo.

In order to isolate the two DC measurements, a direct path from VGA1 input or output may be directly fed to the ADC, while keeping the remaining circuit connected to a common mode voltage with zero DC offset. After the first measurement, a desired DC at mixer can be forced at the mixer output using the DAC 314 under the processor control. Circuit 500 can confirm that the desired offset is achieved by measuring it. The receiver is then returned to normal operating condition as shown in FIG. 3. The processor forces a compensation value through the DAC 342 to a second predetermined value. The circuit 500 can confirm that the desired offset is achieved by measuring it. This offset may be forced to zero usually and sometimes to a non-zero predetermined value that maximizes the IP2. This second value may be applied if the processor detects the operating condition where high IP2 is desired for the RX based on the AGC setting.

It may be possible to achieve the above goal without using a direct connection between the VGA1 input or output to the ADC under software control. In this case, the inner loop forces a zero DC offset thereby practically disappearing from the RX lineup. The processor forces the first pre-determined DC at the mixer which appears gained up the VGA1 and VGA2 gains at the ADC output. The processor applies the correction by de-embedding the DAC+VGA1+VGA2 gain and computing a compensation which when applied to the DAC produces a desired DC at the mixer output. On completing the first step, the second step follows in which the inner loop applies a second pre-determined DC offset at VGA2 input. The output DC is gained up by VGA2 gain and hence, a correction will be needed that de-embeds the inner loop DAC+VGA2 gain.

The principles explained in this application can be extended to more than two offset correction loops in a receiver. With 'N' VGAs, each with a dedicated offset compensation DAC we can form N offset correction loops. An Nth predetermined offset can be applied at the input of Nth offset correction loop to maximize the IP2 of the Nth VGA. The VGA can be implemented to provide filtering in addition to variable gain. The offset at qth VGA is set to the pre-determined value by directly connecting it to the ADC and connecting the following VGA input to a common mode voltage with zero DC offset. After the desired DC is obtained at the input of the respective VGA, the next offset correction loop is addressed. Hence, all VGAs are set to pre-determined "good" DC offset voltages most suitable for the operating condition (AGC step). Alternatively, N−1 loops can be disabled by injecting zero DC values through their corresponding DACs and the loop that needs an injection value to be injected and measured for correctness can be addressed similar to the two loop process described in the previous paragraph.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

Additionally, although the foregoing discloses example systems including, among other components, software executed on hardware, it should be noted that such systems are merely illustrative and should not be considered as limiting. For example, it is contemplated that any or all of these hardware and software components could be embodied exclusively in dedicated hardware, exclusively in software, exclusively in firmware or in some combination of hardware, firmware and/or software. Accordingly, while the following describes example systems, persons of ordinary skill in the art will readily appreciate that the examples are not the only way to implement such systems.

What is claimed is:

1. A receiver comprising:
a low noise amplifier, wherein an output of the low noise amplifier is divided into two signal paths from the low noise amplifier;
a cosine mixer and a sine mixer, each in its respective signal path, and each mixer having an output;
a processor, in circuit with both the cosine mixer and the sine mixer, to determine an amplitude of an offset signal to be applied to the output of each mixer;
each signal path comprising:
a) a first adder in circuit with the processor, and each first adder disposed at an output of each mixer to receive its own offset component, thereby improving the second order intermodulation distortion performance of its respective mixer;
b) a first amplifier in circuit with the first adder to receive an output signal from the first adder and to produce an output signal based thereon,
c) a DC offset canceller connected as an outer DC offset compensation loop, one per individual mixer, comprising:
i) a second adder in circuit with the first amplifier,
ii) an estimator and to add a removal signal to an output of the first amplifier to reduce the DC value of the signal at the output from a second amplifier at the output of the second adder,
iii) a second amplifier that receives an output of the second adder;
iv) an analog to digital converter coupled to an output of the second amplifier;
v) a downsampling reconstructive filter in circuit with the second amplifier, and
vi) an inner DC compensation loop comprising:
the estimator, in circuit with the first amplifier, to
a) estimate a DC value of the output signal of the second amplifier as received from the reconstructive filter and the processor; and
b) generate a removal signal based on the DC value of the output signal from the second amplifier,
wherein the offset signal is a substantially DC signal,
wherein the first and second adders are analog adders, and
wherein the first and second amplifiers are analog amplifiers.

2. A receiver as defined by claim 1, wherein generating the offset signal comprises the use of a look-up table.

3. A receiver as defined by claim 1, wherein generating the offset signal comprises reading a predetermined value of a DC amplitude of the offset signal.

4. A receiver as defined by claim 1, wherein generating the offset signal comprises calculating a DC amplitude of the offset signal based on an output of the receiver.

5. A receiver as defined by claim 1, wherein estimating the DC value of the signal at the output of the circuit component comprises calculating the estimated DC value based on an output of the receiver.

6. A receiver as defined by claim 1, wherein the circuit component comprises an amplifier having a non-zero DC component output.

7. A receiver circuit comprising:
a low noise amplifier, wherein an output of the low noise amplifier is divided into two signal paths from the low noise amplifier;
a cosine mixer and a sine mixer, each in its respective signal path, and each mixer having an output;
a processor, in circuit with both the cosine mixer and the sine mixer, to determine an amplitude of an offset signal of both the cosine mixer and the sine mixer;
each signal path comprising:
a) a first adder in circuit with the processor and disposed at an output of each mixer to receive its own offset signal and to add its own offset signal and the output from its own respective mixer, thereby improving the distortion performance of each of its respective mixers;
b) a filter coupled to an output of the first adder;
c) a first variable gain amplifier coupled to an output of the filter, the output of the first variable gain amplifier having a DC value;
d) a second adder in circuit coupled to the output of the first variable gain amplifier and to add a removal signal to an output of the circuit component to reduce the DC value of the signal at the output from a second variable gain amplifier as presented to additional components,
e) a DC estimator in circuit with the second variable gain amplifier to estimate the DC value of the output of the second variable gain amplifier and to generate a removal signal for the second amplifier based on the DC value of the output of the variable gain amplifier;
f) the second variable gain amplifier that receives an output of the second adder;
g) an analog to digital converter coupled to an output of the second variable gain amplifier;
h) a downsampling reconstructive filter in circuit with the second variable gain amplifier, and
i) an inner DC compensation loop comprising:
the estimator, in circuit with the first variable gain amplifier, to
i) estimate a DC value of the output signal of the second variable gain amplifier as received from the reconstructive filter and the processor; and
ii) generate a removal signal based on the DC value of the output signal from the second variable gain amplifier,
wherein the offset signal is a substantially DC signal,
wherein the first and second adders are analog adders, and
wherein the first and second variable gain amplifiers are analog variable gain amplifiers.

8. A receiver circuit as defined by claim 7, wherein the receiver circuit forms part of an in-phase receiver circuit.

* * * * *